United States Patent [19]
Yang et al.

[11] Patent Number: 6,010,968
[45] Date of Patent: Jan. 4, 2000

[54] METHOD FOR FORMING A CONTACT OPENING WITH MULTILEVEL ETCHING

[75] Inventors: Chan-Lon Yang, Taipei; Tong-Yu Chen; Keh-Ching Huang, both of Hsinchu, all of Taiwan

[73] Assignee: United Microelectronics Corp., Taipei, Taiwan

[21] Appl. No.: 09/220,541

[22] Filed: Dec. 24, 1998

[51] Int. Cl.[7] .................................................. H01L 21/00
[52] U.S. Cl. ............................. 438/719; 438/723; 438/724
[58] Field of Search .................................. 438/719, 723, 438/724

[56] References Cited

U.S. PATENT DOCUMENTS

| | | | |
|---|---|---|---|
| 5,817,579 | 10/1998 | Ko et al. | 438/740 |
| 5,854,124 | 12/1998 | Lin | 438/620 |
| 5,866,485 | 2/1999 | Kirchoff et al. | 438/740 |
| 5,904,566 | 5/1999 | Tao et al. | 438/689 |

*Primary Examiner*—Benjamin Utech
*Assistant Examiner*—Charlotte A. Brown
*Attorney, Agent, or Firm*—Thomas, Kayden, Horstemeyer & Risley

[57] ABSTRACT

A multilevel contact etching method to form a contact opening is provided. The method contains using an inductively coupled plasma (ICP) etcher to produce a high plasma density condition. The plasma gas etchant is composed of $C_4F_8/CH_2F_2/CO/Ar$ with a ratio of 3:4:12:80 so that silicon nitride can be selectively etched while the silicon and silicide are not etched. Each content ratio of the plasma gas etchant allows a variance of about 20%. Wall temperature of the ICP etcher is about 100° C.–300° C. A cooling system for a wafer pad is about −20° C.–20° C. Chamber pressure is about 5–100 mtorr. Bias power on the wafer pad is about 1000 W–3000 W. Source power of an inductance coil is about 500 W–3000 W.

15 Claims, 2 Drawing Sheets

METHOD FOR FORMING A CONTACT OPENING WITH MULTILEVEL ETCHING

BACKGROUND OF THE INVENTION

1. Field of the Invention

This invention relates to semiconductor fabrication, and more particularly to a method for forming a multilevel contact opening.

2. Description of Related Art

Currently, semiconductor fabrication technology has achieved a deep sub-micron level so that semiconductor devices can be fabricated with a high degree of integration. The trend toward miniaturization, in which integrate circuit devices are designed with a higher and higher degree of integration, continues. In order to achieve a desired degree of integration with low fabrication cost, a multilevel contact etching process should be able to simultaneously etch oxide and $Si_3N_4/SiO_xN_y$, and stop on silicon and silicide. However, a current conventional multilevel contact etching process cannot stop on silicon and silicon nitride at the same time due to a poor etching selectivity between oxide and silicide.

FIG. 1A and FIG. 1B are schematic, cross-sectional views of a portion of a substrate, schematically illustrating a contact opening formed by a conventional multilevel contact etching process. In FIG. 1A, there is a silicon substrate 100. A polysilicon, $TiSi_x$/poly, or $WSi_x$/poly layer 110 and a silicide layer 130, such as titanium silicide or tungsten silicide, have been separately formed on the substrate 100. The polysilicon layer 110 can also be a polycide, such as silicide/polysilicon to serve as a main part of a gate. A $Si_3N_4/SiO_xN_y$ layer 120 is formed on the polysilicon layer 110. A silicon oxide layer 140 is formed over the substrate 100 to cover exposed surfaces of the silicon substrate 100, the polysilicon layer 110, the silicide layer 130, and the $Si_3N_4/SiO_xN_y$ layer 120. A photolithography process is performed to define locations on the silicon oxide layer 140 for subsequently forming desired openings. A conventional multilevel contact etching process is performed to etch the silicon oxide layer 140 and the $Si_3N_4/SiO_xN_y$ layer 120 so as to simultaneously form contact openings 150, 160, and 170. The contact opening 150 stops at the silicon substrate 100. The contact opening 160 penetrates through the silicon oxide layer 140 and the $Si_3N_4/SiO_xN_y$ layer 120 and stops at the polysilicon layer 110. The contact opening 170 stops at the silicide layer 130. In an actual situation, the contact opening 170 enters into the silicide layer 130, or completely removes the silicide layer 130 because of over-etching due to a poor etching selectivity between the silicon oxide layer 140 and the silicide layer 130. As shown in FIG. 1A, this causes the silicide layer 130 to be partially or completely removed during over-etching.

The conventional multilevel contact etching process is performed in a magnetically enhanced reactive ion etching (MERIE) etcher with a plasma gas etchant composed of $C_nF_{2n+2}/O_2/CO/Ar$. This plasma gas etchant has a trade-off between selectivity of silicon oxide : silicide and silicon oxide : $Si_3N_4/SiO_xN_y$, and a trade-off between selectivity of silicon oxide : silicide and $Si_3N_4/SiO_xN_y$ as it is completely removed. When the conventional multilevel contact etching process is etching the $Si_3N_4/SiO_xN_y$ layer 120 to expose the polysilicon layer 110, the silicide layer 130 has already been partially or completely removed during over-etching. If the over-etching phenomenon is severe, the silicide layer 130 may be completely etched through. This causes a current leakage in the actual device.

On the other hand, if the contact opening 170 is formed by etching and intended to stop on the silicide layer 130, the contact opening 160 may not be able to extend to the polysilicon layer 110, as shown in FIG. 1 B. A residue of the $Si_3N_4/SiO_xN_y$ layer 120 causes a blind contact opening, and an open circuit therefore occurs.

SUMMARY OF THE INVENTION

It is therefore an objective of the present invention to provide a multilevel contact etching method so as to simultaneously etch oxide and $Si_3N_4/SiO_xN_y$, and stop on silicon and silicide, such as titanium silicide or tungsten silicide. Punching-through of a silicide layer is effectively avoided.

In accordance with the foregoing and other objectives of the present invention, an improved multilevel contact etching method is provided to form a contact opening. The improved method includes using an inductively coupled plasma (ICP) etcher to produce a high plasma density condition. The plasma gas etchant is composed of $C_4F_8$/$CH_2F_2$/CO/Ar with a ratio of 3:4:12:80 so that silicon nitride and silicon oxide can be selectively etched but not silicon and silicide. Each content ratio of the plasma gas etchant allows a variance of about 20%. Wall temperature of the ICP etcher is about 100° C.–300° C. A cooling system for a wafer pad is about –20° C.–20° C. Chamber pressure is about 5–100 mtorr. Bias power of the wafer pad is about 1000 W–3000 W. A source power for an inductance coil is about 500 W–3000 W.

In the foregoing, a silicon-nitride/silicon-oxygen-nitride layer can be effectively etched, but not silicon and silicide, so that various contact openings can be properly and simultaneously formed without silicide punching-through or open contacts.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2:
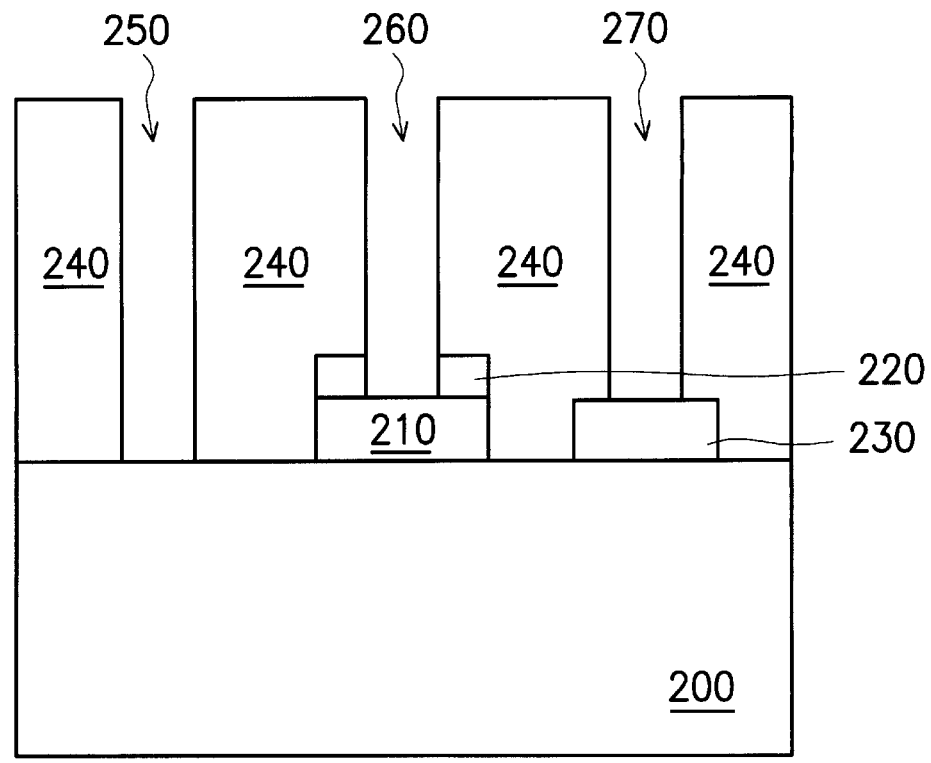
FIG. 2 is a cross-sectional view of a portion of a substrate, schematically illustrating a contact opening formed by a multilevel contact etching process, according to a preferred embodiment of the invention.

FIG. 2 is a cross-sectional view of a portion of a substrate, schematically illustrating a contact opening formed by a multilevel contact etching process, according to a preferred embodiment of the invention. In FIG. 2, there is a semiconductor substrate 200, such as a silicon substrate 200. A polysilicon layer 210 and a silicide layer 230, such as titanium silicide or tungsten suicide, have been separately formed on the substrate 200. The polysilicon layer 210 can be, for example, a transistor gate. The polysilicon layer 210 can also be replaced by polycide, such as titanium-silicide/polysilicon or tungsten-silicide/polysilicon. The polycide material is also a typical material for making a gate structure. The silicide layer 230, for example, is located on a source/drain region of a transistor to increase conductivity. A $Si_3N_4/SiO_xN_y$ layer 220 is formed on the polysilicon layer 210. The $Si_3N_4/SiO_xN_y$ layer 220, or called silicon-nitrogen compound, includes, for example, $Si_3N_4$, $SiO_xN_y$, or both. An oxide layer 240, such as a silicon oxide layer, is formed over the substrate 200 and covers exposed surfaces of the silicon substrate 200, the polysilicon layer 210, the silicide layer 230, and the $Si_3N_4/SiO_xN_y$ layer 220. A photolithography process is performed to define locations on the oxide layer 240 for subsequently forming desired openings. A multilevel contact etching process according to the invention is performed to etch the oxide layer 240 and the $Si_3N_4/SiO_xN_y$ layer 220 so as to simultaneously form, for example, contact openings 150, 160, 170. In the invention, the contact openings 250, 260 and 270 respectively just expose the silicon substrate 200, the polysilicon layer 210, and the silicide layer 230. This result can be achieved by an etching mechanism described in the following.

After the oxide layer 240 is formed over the silicon substrate 200, the contact openings 250, 260, 270 are, for example, formed in the oxide layer 240. The contact openings 250, 260, 270 have their individual purposes of exposing different locations of a device formed on the substrate 200. The contact opening 250 needs, for example, to just expose the silicon substrate 200, in which the oxide layer 240 is to be etched. The contact opening 260 needs, for example, to just expose the polysilicon layer 210, in which both the oxide layer 240 and the $Si_3N_4/SiO_xN_y$ layer 220 are to be etched. The $Si_3N_4/SiO_xN_y$ layer 220 includes, for example, $Si_3N_4$, $SiO_xN_y$, or both. The contact opening 270 needs, for example, to just expose the silicide layer 230, in which the oxide layer 240 is to be etched. The contact openings 250, 260, 270 have different etching stop points. An ideal multilevel contact etching process has to first consider protection for the silicide layer 230 and silicon elements, such as the silicon substrate 210 and the polysilicon layer 220. A second consideration is how to etch the $Si_3N_4/SiO_xN_y$ layer 220 without damaging the polysilicon layer 210.

Generally, when a fluorocarbon plasma is used as an etchant, fluorine radicals of fluorine atoms are used to react with silicon atoms to form $SiF_x$ species so as to evaporate silicon material. In addition, fluorine-carbon radicals are used to form CO and $CO_2$ gas through a reaction with oxygen containing gases, in which several fluorine radicals are also released for a further reaction with silicon atoms and to obtain a further etching effect. Otherwise, the fluorine-carbon radicals may react to each other so that carbon-fluorine polymer molecules are formed and deposited on the wafer surface, causing an etching performance. As silicon oxide is etched, since the silicon oxide itself provides oxygen atoms to react with the fluorine-carbon radicals, there is only a little or no carbon-fluorine polymer that can be deposited on the silicon oxide surface. Silicon oxide is continuously etched without stop. However, the carbon-fluorine polymer also deposit on a material surface including no oxygen atoms, such as silicon, silicide, silicon nitride, or silicon oxygen nitride, all of which are included in the device. The carbon-fluorine polymer can stop fluorocarbon plasmas etching.

In FIG. 2, in order to protect the silicon substrate 200, polysilicon layer 210, and the silicide layer 230 from being over-etched, a greater production of carbon-fluorine polymer is desired. This can be achieved by choosing a fluorocarbon source having smaller F/C ratio. The number of carbons preferably is in a range of 2–6, in which perfluoro-cyclobutane ($C_4F_8$) is a candidate. For the perfluoro-cyclobutane ($C_4F_8$) compound, there are four carbons. Moreover, the $C_4F_8$ molecules have cyclic structure bonds so that they can easily polymerize in the plasma and form larger polymer molecules.

For further consideration, in order to prevent the carbon-fluorine polymer molecules from being oxidized away, the etchant gas does not include oxygen gas, which is a strong oxidant. A sufficient quantity of carbon-fluorine polymer can be accumulated at surfaces on the silicon substrate 200, the polysilicon layer 210, and the silicide 230.

A further consideration is to etch silicon nitrogen compound with a sufficiently large selectivity, in which the silicon nitrogen compound includes, for example, silicon nitride or silicon oxynitride. A $C_xH_yF_z$ compound, such as $CH_2F_2$, $CH_3F$, $CHF_3$, $C_2H_2F_4$, $C_3H_2F_6$ and so on, can react with other C—F compounds to form a new C—F—H polymer, which is a key factor in increasing etching selectivity between silicon/silicide and silicon-nitride/silicon-oxynitride material, which forms the silicon-nitride/siliconoxynitride layer 210.

Moreover, a CO gas or other soft oxidant can be added so as to avoid too much C—F polymer accumulating in the contact openings 250, 260, 270. If too much C—F polymer is accumulated, the etching rate during formation of the contact openings 250, 260, 270 may slow down, or the etching process may even stop before the contact openings 250, 260, 270 are formed. Here, a strong oxidant, such as oxygen, is not added because it would completely oxidize the $C_xH_yF_z$ compound out and reduce the selective etching performance on the silicon, polysilicon, and silicide. Furthermore, a noble gas, such as argon gas, is also added into the etchant because argon ions have stronger bombardment effect on the wafer and thus increase the vertical etching rate.

In summary of the above discussions, during the multilevel contact opening etching process, a $C_xF_y$ compound, such as perfluoro-cyclobutane ($C_4F_8$), is added into the etchant to etch silicon oxide but protect silicon and silicide due to a carbon-rich C—F polymer accumulation. The $C_xH_yF_z$ compound is added to have a sufficient etching selectivity between silicon/silicide and silicon-nitride/silicon-oxynitride. A soft oxidant, such as CO gas, is added to oxidize the C—F polymer to avoid a too much accumulation, causing an etching stop. The soft oxidant also ensures that the $C_xH_yF_z$ compound is not greatly oxidized out, causing a poor etching selectivity on silicon, polysilicon, and silicide. A noble gas, such as argon, is added to provide a bombardment effect so as to achieve the goal of anisotropic etching.

Returning to the actual application, a plasma gas etchant, for example, is chosen as a mix gas of $C_4F_8/C_xH_yF_x/CO/Ar$, in which $C_xH_yF_x$ preferably is $CH_2F_2$. After an experiment, a preferred ratio is obtained as, for example, 3:4:12:80, each of which allows a variance of about 20%, such as 2.4–3.6:3.2–4.8:9.6–14.4:64–96. In other word, the $C_4F_8/CH_2F_2/CO/Ar$ gas has a gas flushing rate ratio of about 5–25 5–30:10–100:100–600 in a unit of standard cubic centimeter per minute (sccm).

Figure 3:
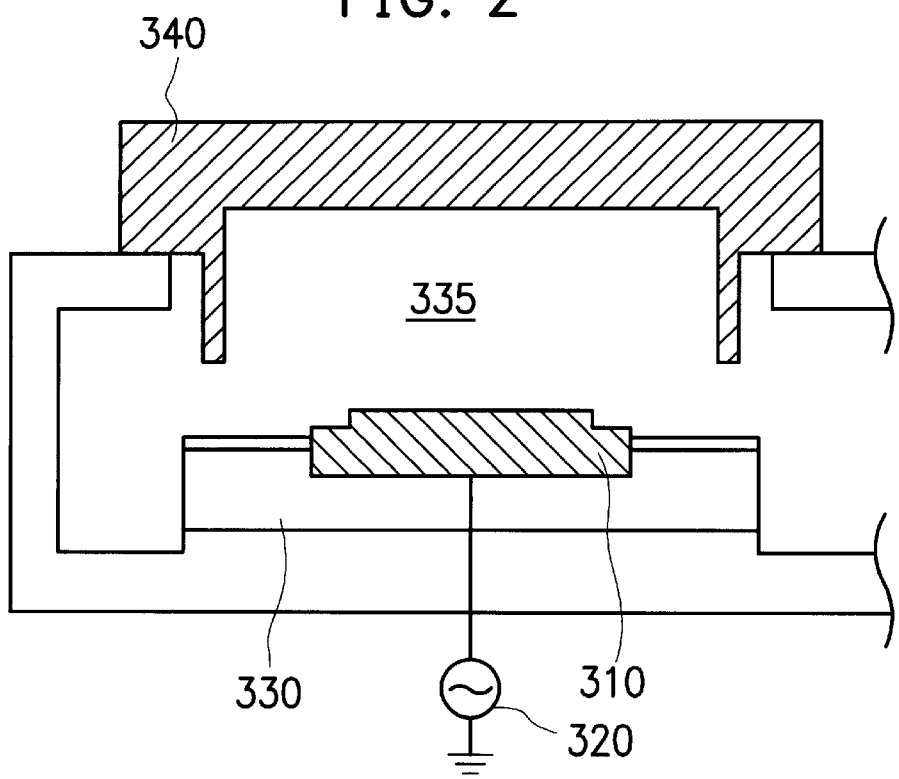
FIG. 3 is a cross-sectional view, schematically illustrating a structure of an ICP etcher.

The multilevel contact etching process of the invention is preferably performed on an inductively coupled plasma (ICP) etcher, and is also suitable for other types of etchers. FIG. 3 is a cross-sectional view of an ICP etcher, schematically illustrating a structure of the ICP etcher. During etching, some control parameters of the ICP must also be set to proper quantities. For example, an etcher wall 340 is set at a temperature of about 100° C.–300° C. An etching chamber 335 is set at a pressure of about 5–100 mtorr, and a cooling system 330 on a wafer electrode pad 310 is maintained at a temperature of about −20° C.–20°C. An inductance coil is set to have a power of about 500 W–3000 W so as to provide a needed plasma density and kinematical energy. The wafer electrode pad 310 is set at a bias power of about 1000 W–3000 W from a power source 320.

Figure 1A:
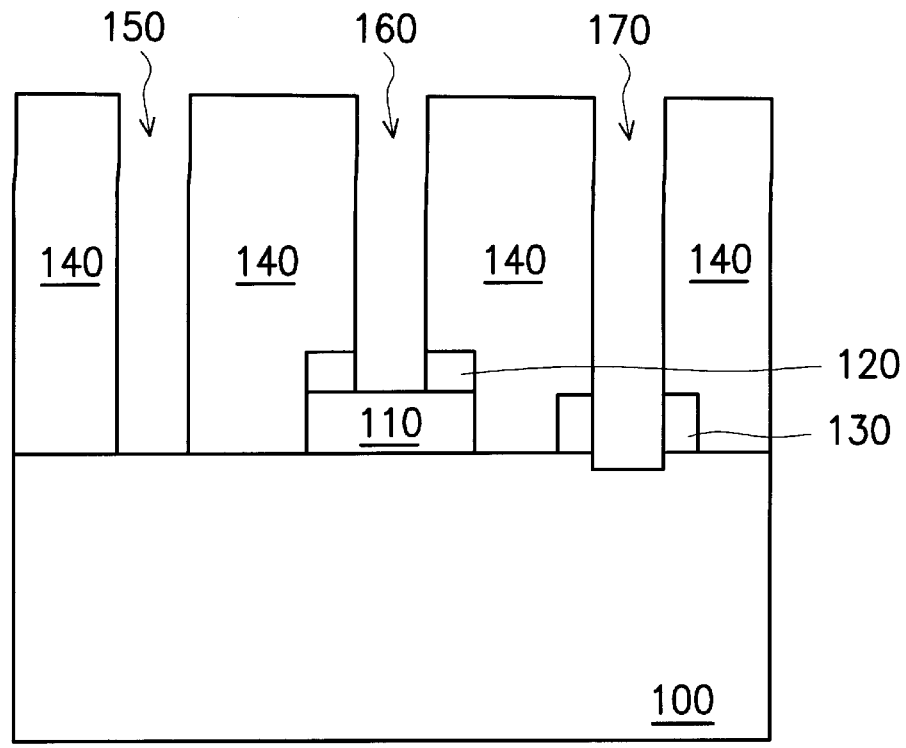
FIG. 1A and FIG. 1B are cross-sectional views of a portion of a substrate, schematically illustrating a contact opening formed by a conventional multilevel contact etching process.
Figure 1B:
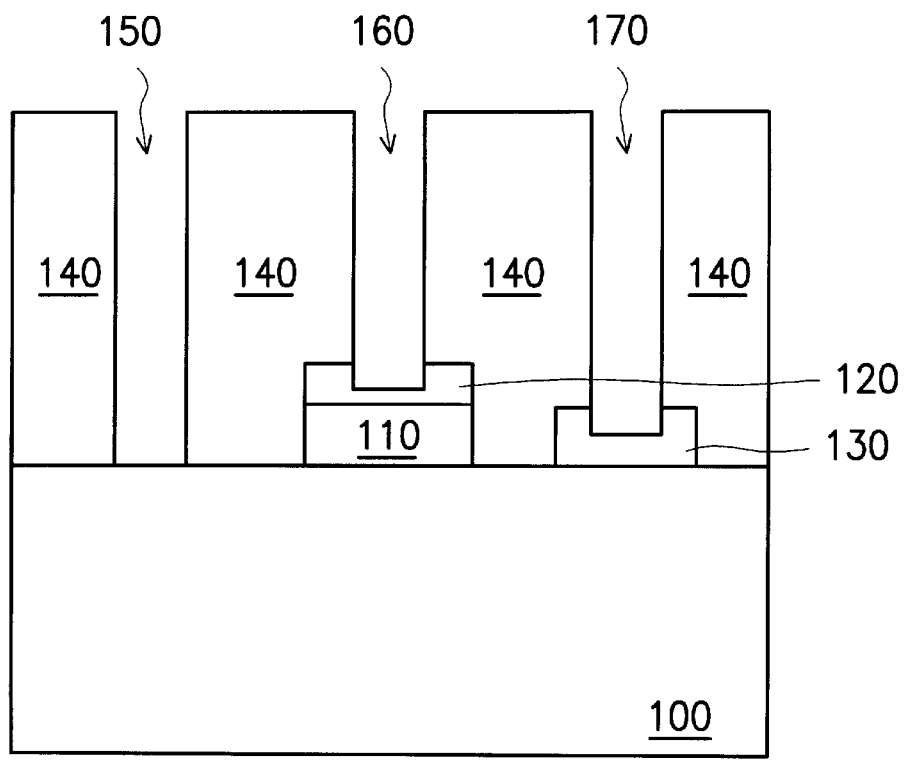

Returning to the example of FIG. 2, by using the gas etchant of $C_4F_8/CH_2F_2/CO/Ar$ with a ratio of 3:4:12:80, and performing the multilevel contact etching process with the ICP etcher, a much better etching performance is obtained. As a result, the silicon-nitride/silicon-oxynitride layer 220 with a thickness of 1000 Å is etched through to just expose the polysilicon layer 210 and the silicide layer 230 is expose by the contact opening 270 without being completely etched away. In the conventional etching process that is performed on the MERIE etcher with the etchant of $C_nF_{2n+2}/O_2/CO/Ar$, when the silicon-nitride/silicon-oxynitride layer 120 of FIG. 1A with a thickness of 1000 Å is etched through to expose the polysilicon layer 110, the silicide layer 130 is etched though and the silicon substrate 100 is also etched by about 1000 Å, which causes high contact resistance and high leakage currents. A wafer acceptance testing process is performed after contact plugs (not shown) are completed. Results show that the contact resistance is effectively reduced and the leakage current is reduced by about a factor of 10.

In conclusion, the invention uses a gas etchant composed of $C_4F_8/CH_2F_2/CO/Ar$ with a ratio of 3:4:12:80 to perform the multilevel contact etching process. The desired goal of simultaneously etching oxide and $Si_3N_4/SiO_xN_y$, and stopping on silicon and silicide is achieved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A multilevel contact etching method for forming a plurality of contact openings, the method comprising:

providing a semiconductor substrate, wherein a patterned polysilicon or polycide structure and a silicide layer are separately formed over the semiconductor substrate at different locations, a silicon-nitrogen compound layer is formed on top of the patterned polysilicon or polycide structure, and an oxide layer is formed over the substrate; and performing a patterning process on the oxide layer and the silicon-nitrogen compound layer to form the contact openings, which are simultaneously formed to separately just expose the semiconductor substrate, the patterned polysilicon or polycide structure, and the silicide layer, wherein the patterning process comprises a plasma etching process with a gas etchant, which is obtained by flushing perfluoro-cyclobutane ($C_4F_8$) with a flushing rate of about 5–25 sccm, $C_xH_yF_z$ with a flushing rate of about 5–30 sccm, CO with a flushing rate of about 10–100 sccm, and argon with a flushing rate of about 100–600 sccm.

2. The method of claim 1, wherein the semiconductor substrate comprises silicon.

3. The method of claim 1, wherein the patterned polysilicon or polycide structure serves as a part of a gate.

4. The method of claim 1, wherein the silicon-nitrogen compound comprises silicon nitride, silicon oxynitride, or both.

5. The method of claim 1, wherein the silicide layer comprises titanium silicide or tungsten silicide.

6. The method of claim 1, wherein in the step of performing the patterning process, the plasma etching process comprises an inductively coupled plasma (ICP) etcher.

7. The method of claim 6, wherein the ICP etcher is operated with operational conditions that comprise:

a power of about 500 W–3000 W for a inductance coil;

a bias power of about 1000 W–3000 W for a wafer electrode pad;

a pressure of about 5–100 mtorr in an etching chamber;

a temperature of about 100° C.–300° C. for an etching chamber wall; and a temperature of about −20° C.–20° C. for a cooling system attached to the wafer electrode pad.

8. The method of claim 1, wherein in the step of performing a patterning process, the gas etchant of perfluoro-cyclobutane ($C_4F_8$)/$C_xH_yF_z$/CO/Ar comprises a relative content ratio of about 3:412:80, with about a 20% variance of each individual ratio.

9. A multilevel contact etching method for forming a plurality of contact openings, the method comprising:

providing a semiconductor substrate, wherein a silicide layer and a silicon nitrogen compound layer are separately formed over the semiconductor substrate at different locations, and an oxide layer is formed over the substrate; and patterning the oxide layer and the silicon-nitrogen compound layer to form the contact openings, which are simultaneously formed to separately just stop on the semiconductor substrate and the silicide layer, wherein the patterning process comprises a plasma etching process with a gas etchant of perfluoro-cyclobutane ($C_4F_8$)/$C_xH_yF_z$/CO/Ar.

10. The method of claim 9, wherein in the step of patterning the oxide layer and the silicon-nitrogen compound layer, the gas etchant of perfluoro-cyclobutane ($C_4F_8$)/$C_xH_yF_z$/CO/Ar comprises a relative content ratio of about 2.4–3.6:3.2–4.8:9.6–14.4:64–96.

11. The method of claim 9, wherein the semiconductor substrate comprises silicon, and a portion of the semiconductor substrate covered by the silicon-nitrogen compound layer further comprises a patterned polysilicon or polycide structure.

12. The method of claim 9, wherein the silicon-nitrogen compound comprises silicon nitride, silicon oxynitride, or both.

13. The method of claim 9, wherein in the step of performing the patterning process, the plasma etching process comprises an inductively coupled plasma (ICP) etcher.

14. The method of claim 13, wherein the ICP etcher is operated with operation conditions that comprise:

a power of about 500 W–3000 W for an inductance coil;

a bias power of about 1000 W–3000 W at a wafer electrode pad;

a pressure of about 5–100 mtorr in an etching chamber;

a temperature of about 100° C.–300° C. for an etching chamber wall; and a temperature of about −20° C.–20° C. for a cooling system attached to the wafer electrode pad.

15. The method of claim 9, wherein between the silicon-nitrogen compound layer and the semiconductor substrate a polysilicon layer or a polycide layer is further comprised so that one of the contact openings stops on the polysilicon layer or the polycide layer.

* * * * *